Dec. 31, 1968 F. O. BACH 3,419,394
LIGHT SENSITIVE LITHOGRAPHIC PLATE OF A WATER SOLUBLE
DIAZO COMPOUND AND A HYDROPHILIC FILLER MATERIAL
Filed Nov. 18, 1964

INVENTOR
Frederick O. Bach
by McDougall, Hersh & Scott
Att'ys 3,419,394

LIGHT SENSITIVE LITHOGRAPHIC PLATE OF A WATER SOLUBLE DIAZO COMPOUND AND A HYDROPHILIC FILLER MATERIAL

Frederick O. Bach, Villa Park, Ill., assignor to A. B. Dick Company, Niles, Ill., a corporation of Illinois
Filed Nov. 18, 1964, Ser. No. 412,099
8 Claims. (Cl. 96—75)

ABSTRACT OF THE DISCLOSURE

A light sensitive lithographic plate formed of a base sheet having a surface which is hydrophobic, ink receptive and water repellent, and a coating directly on the surface formulated of a finely divided hydrophilic inorganic filler and a light sensitive resin forming diazo compound which is converted to a water insoluble resinous binder upon exposure to light whereby, when the plate is exposed, the hydrophilic filler in the exposed portions becomes bonded by the diazo resin to the underlying hydrophobic surface to define the water receptive hydrophilic portion of the plate while the diazo compound and filler in the unexposed portions are washed from the plate to expose the underlying hydrophobic ink receptive surface as the imaged portion of the lithographic plate.

This invention relates to the preparation of a photolithographic or light sensitive lithographic plate and it relates more particularly to a new and improved photolithographic plate and to a method for the imaging of same.

To the present, photolithographic or light sensitive lithographic plates have been employed wherein the plate is fabricated of a base sheet having a hydrophilic, water receptive, ink repellent lithographic surface, such as a silicated or anodized aluminum surface and wherein the lithographic surface is presensitized by coating with a water soluble resin-forming diazo compound which is converted upon exposure to light to a resinous ink receptive, water repellent imaging material which functions as the ink receptive, water repellent image leaving the unexposed water soluble diazo compound to be washed away during development of the plate to re-expose the underlying water receptive, ink repellent lithographic surface as the non-imaged portion of the plate.

Such presensitized photolithographic plates are fabricated by the application of plural coatings including at least one first coating to render the surface ink repellent and water receptive and additional coatings, such as of a diazo compound or other light sensitive material which is converted, on exposure to light, to the water repellent, ink receptive image on the water receptive, ink repellent lithographic surface.

Such presensitized photolithographic or light sensitive plates also require a number of processing steps in use to de-sensitize the exposed plate, to fix the image, and to lacquer the plate, all of which add up to a complicated time-consuming and expensive procedure which inhibits wide-spread usage of the plate and more or less restricts its application and preparation to highly skilled and technically trained personnel.

Further, when the imaged portion constitutes the reaction product of a material coated onto the lithographic base, the plate is subject to a number of other limitations from the standpoint of its operation and results. The imaging material can be readily picked off of the hydrophylic lithographic surface when wet under the conditions of use thereby to limit the number of copies of good quality that can be secured from the plate. Sometimes, when the imaged plate is wet with repellent during normal usage of the plate, the ink receptive, water repellent imaging material is incapable of retaining a desired bonded relationship with the underlying ink repellent, water receptive lithographic surface such that the image or parts thereof "walks off" of the plate whereby the plate becomes incapable of additional use for the production of copies.

It is an object of this invention to produce and to provide a method for producing a new and improved photolithographic or light sensitive lithographic plate and to a new and improved method for imaging same and it is a related object to produce a lithographic light sensitive plate of the type described which is simple in construction, which can be prepared with a minimum number of coatings, which does not require multiple coatings or processing steps in the imaging or use thereof, in which the ink receptive imaged portion forms an integral part of the plate whereby to militate against "picking off" of the image or "walk off" of the image, and which can be imaged and used with a minimum amount of work and technological know-how.

These and other objects and advantages of this invention will hereinafter appear and, for purposes of illustration, but not of limitation, an embodiment of the invention is shown in the accompanying drawings, in which—

In accordance with the practice of this invention, the conventional concept in the construction of a light sensitive lithographic or photolithographic plate is completely reversed in that, instead of coating the lithographic water receptive, ink repellent surface with a composition that reacts in response to light to form the ink receptive, water repellent image on the lithographic surface, use is made of a base sheet provided with an ink receptive, water repellent surface formed on or as a part of the base sheet while a coating is applied to the ink receptive, water repellent surface wherein the coating is formulated to contain a hydrophilic, water receptive, ink repellent component in the form of a hydrophilic filler or pigment with a water soluble component which, in response to exposure to light, is converted to a water insoluble binder that operates to secure the water receptive, hydrophilic pigment in the exposed areas to form the water receptive, ink repellent non-imaged portion on the ink receptive, water repellent surface.

The water receptive pigment is washed away with the water soluble binder component remaining in the unexposed areas to re-expose the underlying water repellent, ink receptive surface as the imaged portion of the lithographic plate. Thus the repellent or other aqueous medium applied to the surface of the plate during normal use in the production of copies does not affect the plate surface in a manner to weaken the bond between the non-imaged portion and the underlying imaged portion which forms a more permanent part of the plate.

Reference will now be made to the accompanying drawing for a fuller description of the new and novel lithographic plate, its method of manufacture and use in the production of an imaged lithographic master from which multiple copies can be produced by conventional lithographic technique.

Figure 1:
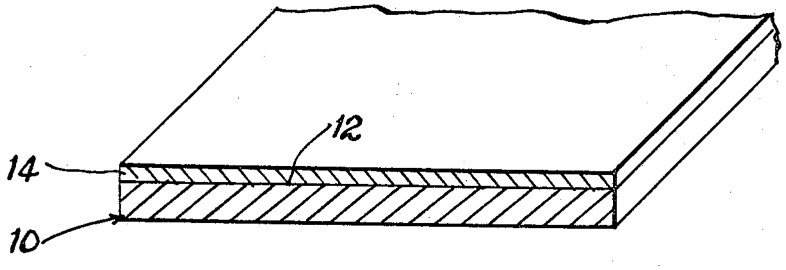
FIG. 1 is a perspective view partially in section of a light sensitive lithographic plate embodying the features of this invention.
Figure 2:
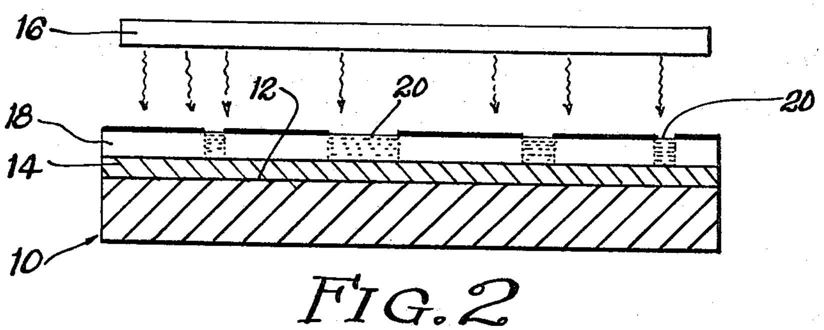
FIG. 2 is a sectional elevational view illustrating the step of imaging the plate by exposure through a positive transparency.
Figure 3:
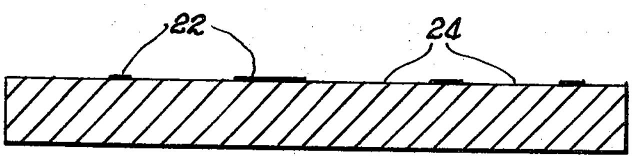
FIG. 3 is a sectional elevational view of the imaged lithographic plate.

In FIG. 1, illustration is made of a base sheet 10 having an ink receptive, water repellent surface 12. In the preferred practice of the invention, the base sheet is formed of a continuous film or flexible sheet of a hydrophobic plastic material such as cellulose triacetate, cellulose acetate butyrate, polystyrene, polyalkylacrylate, polyester and the like, but it can also be formed of a base sheet or film formed of paper, metal and the like laminated with a film of the hydrophobic resinous material of the type described, or else coated with a hydrophobic resinous material of the type described or an oil, alkyd resin, oil modified alkyd resin, and the like.

The hydrophobic surface 12 is provided with a continuous coating 14 of a composition containing a hydrophilic pigment or powder and a water soluble, light sensitive resin-forming material which reacts to form a water insoluble resinous binder upon exposure to light.

A coating composition of the type described can be represented by the following example:

| | Parts by weight |
|---|---|
| Colloidal silica (30% solids) (Ludox LS–E. I. du Pont de Nemours & Co.) | 1 |
| Sulfonated diazo resin (sulfate salt of paradiazodiphenyl amine) (1% solution) | 5 |
| Water | 5 |

The composition of the above example is coated on a 2 mil film of cellulose triacetate in a coating weight of about 1 pound per 3000 square feet of surface area. When dried, the surface 12 was provided with an overall coating 14 of the colloidal silica in the diazo light sensitive resin-forming material. The coated sheet 10 was used as a master. The image was formed on the plate by exposure to ultra-violet light 16 through a positive transparency 18. In the areas 20 where the light strikes through the transparency to the coating 14, the water soluble diazo resin-forming material is decomposed to form a water insoluble resin which thereafter functions as a binder to hold the hydrophilic pigment particles of colloidal silica to the lithographic plate surface to constitute the water wettable, water receptive, ink repellent, non-imaged portion 22 of the plate. The water soluble diazo resin-forming material remains sufficiently soluble in the unexposed portions 24 of the plate to enable the diazo resin-forming material and pigment to be removed by washing, as by the etch applied during normal use of the plate, or by a separate washing step, to re-expose the base material or hydrophobic surface which remains ink receptive and water repellent to constitute the imaged portion 24 of the plate.

Instead of making use of the sulfate salt of paradiazodiphenyl amine, use can be made of other water soluble light sensitive diazo compounds which are decomposed to a water insoluble resin upon exposure to light, such for example as the No. 4–E diazo resin of Fairmount Chemical Company, or sulfonate diazo resin-forming materials of the type described in the Jewett et al. Patent No. 2,714,006, or use can be made of other water soluble UV polymerizable resin-forming materials which are capable of being formed into a water insoluble binder upon exposure to light.

It is sufficient if the amount of light sensitive binder is present in the coating in an amount corresponding to the ratio of 1 part by weight of such resin-forming material to 1–20 parts by weight of hydrophilic pigment or filler, but it is preferred to employ the components in the ratio of 1 part by weight of the water soluble, light sensitive adhesive forming material to 4–10 parts by weight of the hydrophilic filler or pigment.

As the hydrophilic component, use is made of colloidal silica but other hydrophilic fillers or pigments can be employed such as glass powder or glass dust, finely divided silica, satin white and the like. A coating weight of ½ to 1½ pounds per 3000 square feet is sufficient where the exposure time is short. Where longer exposures are possible, coating weights may be increased up to 1½ to 5 pounds per 3000 square feet of surface area.

Other sources of light can be employed other than the UV arc, depending somewhat upon the sensitivity and the characteristics of the light sensitive resin-forming or polymerizable materials present to form the binder component with the hydrophilic filler or pigment in the coating.

It will be apparent from the foregoing that I have provided a new and novel concept in a photolithographic plate wherein the non-wettable portion of the plate, corresponding to the imaged portion of the plate, constitutes an integral part of the plate or else is strongly bonded to the plate while the water wettable or non-imaged portion of the plate is present as an overcoating on the non-wettable imaged portion of the plate thereby to avoid the conditions heretofore available in conventional plate construction which encourages the establishment of a weak bonding relationship between the imaged portions and the non-imaged portions whereby the imaged portions can be readily "picked off" of the plate or else allowed to "walk off" of the plate.

It will be apparent also that the concepts of this invention provide for a light sensitive lithographic plate which embodies a minimum number of coatings and a minimum number of processing steps since the plate produced in accordance with the practice of this invention can be employed for the production of copies by conventional lithographic techniques without the need for the step of desensitizing the plate, which does not require fixing the image on the plate, and which does not require lacquering. As used herein and in the claims, the terms hydrophilic "filler" is intended to include hydrophilic pigments.

It will be understood that changes may be made in the details of construction, arrangement and operation, without departing from the spirit of the invention, especially as defined in the following claims.

I claim:

1. A light sensitive lithographic plate consisting of a base sheet having a hydrophobic, ink receptive, water repellent surface and a coating directly on said surface consisting essentially of a finely divided hydrophilic filler and a water soluble light sensitive resin forming diazo compound which converts to a water insoluble resin upon exposure to light.

2. A lithographic plate as claimed in claim 1 in which the base sheet comprises a film of plastic material.

3. A lithographic plate as claimed in claim 1 in which the base sheet comprises a sheet of cellulose acetate.

4. A lithographic plate as claimed in claim 1 in which the base sheet is a flexible sheet having a surface treated to render the surface hydrophobic, ink receptive and water repellent.

5. A lithographic plate as claimed in claim 1 in which the base sheet is a paper base sheet having a coating of a hydrophobic, ink receptive, water repellent material.

6. A lithographic plate as claimed in claim 1 in which the hydrophilic filler is colloidal silica.

7. A lithographic plate as claimed in claim 1 in which the filler and the diazo compound are present in the coating in the ratio of 1 part by weight diazo compound to 1–20 parts by weight filler.

8. A lithographic plate as claimed in claim 1 in which the filler and the diazo compound are present in the coating in the ratio of 1 part by weight diazo compound to 4–10 parts by weight filler.

References Cited

UNITED STATES PATENTS

| | | | |
|---|---|---|---|
| 2,714,066 | 7/1955 | Jewett et al. | 96—33 X |
| 3,245,784 | 4/1966 | Stricklin | 96—33 X |
| 2,937,085 | 5/1960 | Seven et al. | 96—33 |
| 3,062,648 | 11/1962 | Crawford | 96—33 X |
| 3,236,646 | 2/1966 | Steppan et al. | 96—33 |
| 3,287,128 | 11/1966 | Lugasch | 96—33 |

FOREIGN PATENTS

| | | |
|---|---|---|
| 775,414 | 5/1957 | Great Britain. |

NORMAN G. TORCHIN, *Primary Examiner.*

R. MARTIN, *Assistant Examiner.*

U.S. Cl. X.R.

96—87.